United States Patent
Redman-White

(10) Patent No.: US 10,348,274 B2
(45) Date of Patent: Jul. 9, 2019

(54) ELECTRONIC TUNING SYSTEM

(71) Applicant: William Redman-White, Alton (GB)

(72) Inventor: William Redman-White, Alton (GB)

(73) Assignee: William Redman-White, Alton (GB)

( * ) Notice: Subject to any disclaimer, the term of this patent is extended or adjusted under 35 U.S.C. 154(b) by 112 days.

(21) Appl. No.: 15/628,668

(22) Filed: Jun. 21, 2017

(65) Prior Publication Data
US 2017/0373671 A1 Dec. 28, 2017

(30) Foreign Application Priority Data
Jun. 25, 2016 (GB) .................................. 1611091.8

(51) Int. Cl.
  *H03J 5/24* (2006.01)
  *H04B 5/00* (2006.01)
  *G06K 7/10* (2006.01)
  *H02J 50/12* (2016.01)
  *H03J 1/06* (2006.01)
  *H02J 7/02* (2016.01)

(52) U.S. Cl.
  CPC .......... *H03J 5/244* (2013.01); *G06K 7/10148* (2013.01); *H02J 50/12* (2016.02); *H03J 1/06* (2013.01); *H03J 5/24* (2013.01); *H04B 5/0031* (2013.01); *H04B 5/0037* (2013.01); *H02J 7/025* (2013.01); *H03J 2200/06* (2013.01); *H03J 2200/10* (2013.01); *H04B 5/0075* (2013.01)

(58) Field of Classification Search
  CPC ...... H03J 5/244; H03J 1/06; H03J 5/24; H03J 2200/06; H03J 2200/10; H02J 50/12; H02J 7/025; H04B 5/0037; H04B 5/0031; H04B 5/0075; G06K 7/10148
  USPC ....................... 333/17.1, 17.2, 32, 24 C, 262
  See application file for complete search history.

(56) References Cited

FOREIGN PATENT DOCUMENTS

GB          2524602 A  *  9/2015  ........... H04B 5/0031

* cited by examiner

*Primary Examiner* — Robert J Pascal
*Assistant Examiner* — Jorge L Salazar, Jr.

(57) ABSTRACT

A system is described for maintaining an inductive-capacitive (LC) network at resonance while the excitation frequency may be varied between a number of discrete frequencies at desired instants controlled by a modulation input, while taking into account component parameter errors due environmental and ageing as well as manufacturing tolerances. Control of the resonance while the excitation frequency changes permits the transmission of frequency modulation (FM) or frequency shift keying (FSK) information through an inductively coupled power transfer system.

19 Claims, 14 Drawing Sheets

ELECTRONIC TUNING SYSTEM

DESCRIPTION OF INVENTION

In inductively coupled systems such as radio frequency identification (RFID), implanted biomedical devices or wireless charging it is desirable to have a transmitter or reader function that generates a strong magnetic field with a minimum power for the transmitter circuitry. As a result, it is desirable to use an antenna inductor in a resonant circuit with a high quality factor (Q), since a high Q gives a high circulating current with a lower drive voltage. However, makes the system very sensitive to tuning errors due to component manufacturing tolerances and post manufacture parametric drift from environmental factors and ageing. A further problem arising from a high Q antenna coil is the severe restriction it places on the bandwidth for any communication channel associated therewith, whether the modulation employed is amplitude, frequency or phase or some combination thereof. These problems apply similarly to other electronic systems and diverse applications employing inductive-capacitive resonant circuits.

Hence it is desired to be able to compensate automatically for manufacturing tolerances and component parameter drift by means of some tuning system, preferably with some automatic mechanism to sense errors and compensate therefor. Any tuning system needs to be capable of operating with large signals and thus continuously variable reactance techniques common in radio design are unsuitable.

In GB2524602B a method is disclosed wherein suitable automatic tuning is achieved by means of switching additional capacitance in and out of the tuned circuit in a synchronous fashion and deriving an error signal from observation of the voltage across at least one switch when it is open. The information derived from said voltage across said switch is particularly useful as information relating to the tuning error since it is available on a cycle by cycle basis, allowing rapid corrections to be made. Other prior art mainly has mainly used the idea of varying an excitation frequency with a small deviation either side of the expected resonance and searching for a maximum response, with consequently slower and more uncertain optimisation of tuning.

GB2524602B also describes a means to permit the transmission of frequency modulation through a high Q resonant circuit by means of measuring the required tuning inputs required as a function of frequency, and using this information to vary the LC circuit tuning while the excitation frequency is varied. However, this requires a calibration process in advance of any transmission period. Further, there is the possibility of the LC component values drifting if the transmission period is significantly long in duration. A further desirable feature not provided by GB2524602B is the capability for fast phase modulation of the transmitted carrier signal. Such a modulation scheme is preferable in many applications as it maintains substantially continuous power transfer, and it further allows the receiving antenna resonant frequency to remain substantially fixed thereby simplifying the circuitry for the receiver where power, space and cost are of great significance.

BRIEF SUMMARY OF THE INVENTION

It is an aim of some embodiments to provide means for maintaining an inductive-capacitive (LC) network at resonance while the excitation frequency may be varied between a number of discrete frequencies at desired instants controlled by a modulation input in order to permit frequency modulation (FM) or frequency shift keying (FSK), while taking into account component parameter errors due environmental and ageing as well as manufacturing tolerances. Such means should be automatic and require minimal external input for satisfactory operation.

It is further an aim of some embodiments to provide means to maintain an LC network at resonance while the excitation frequency is varied on a cycle by cycle basis between a number of discrete frequencies at desired instants controlled by a modulation input to permit at phase modulation (PM) in discrete phase increments or phase shift keying (PSK) while taking into account component parameter errors due environmental and ageing as well as manufacturing tolerances. Such means should similarly be automatic and require minimal external input for satisfactory operation.

The described embodiments are applicable to LC resonant circuits in a wide range of applications, but are of particular value in inductively coupled systems such as RFID or wireless charging.

The embodiments will now be described solely by way of example and with reference to the accompanying drawings.

DETAILED DESCRIPTION OF THE INVENTION

The description provided herein is not to be taken in a limiting sense but is made merely for the purposes of describing the general principles of the embodiments of the invention. It will be apparent to one skilled in the art that there are many possible implementations of the invention that are substantially analogue or substantially digital or a mixture of these techniques.

Figure 1:
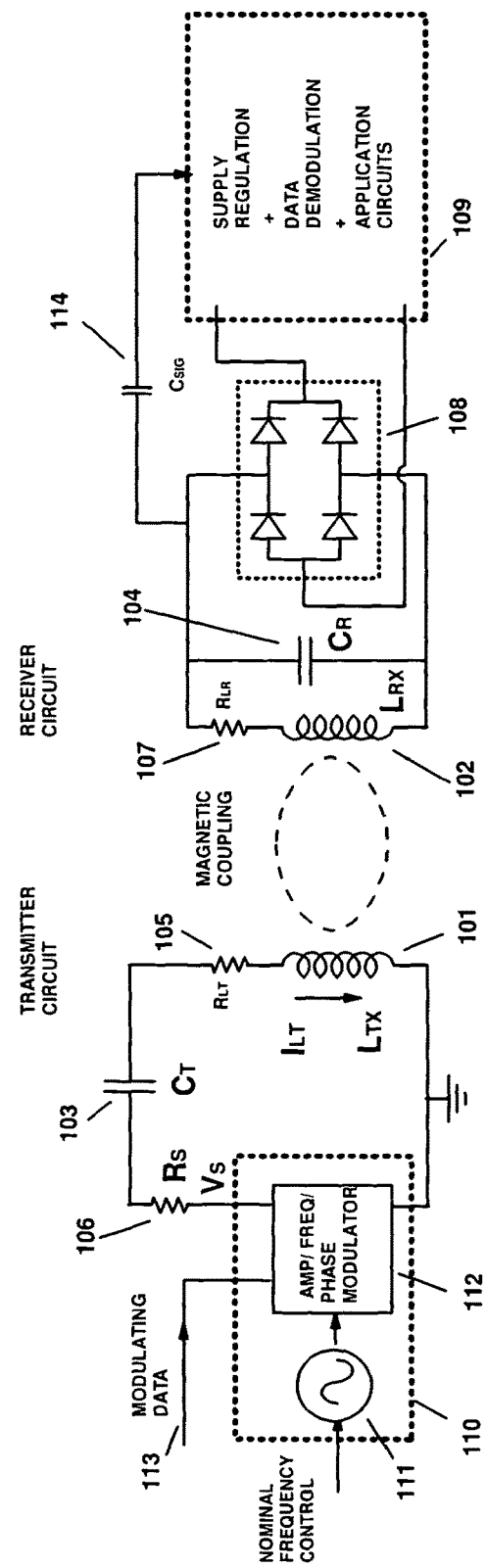
FIG. 1 shows an example of an inductively coupled power and communications system.

FIG. 1 shows a generic example of an inductively coupled system. The transmitting apparatus comprises a signal source 110 in which there is a provided a carrier signal source 111, whose nominal frequency is typically determined according to some accepted technical standard. The carrier may be modulated in terms of its amplitude, frequency or phase according to a data input signal 113 acting on a modulator function 112. These data may be intended to convey significant information as in the case of a smart card or radio frequency identification (RFID) system, or the data may be used primarily to control the properties of power transfer in the system. The signal is passed to a coil antenna 101 where the signal current generates a magnetic field. It is common to make the coil antenna resonate at the transmitting frequency by means of an additional capacitor 103. The losses in the resonant circuit so formed due to resistance and losses in the source itself 106 and in the inductor 105 will limit the quality factor (Q). A high quality factor is advantageous in order to maximise the circulating current in the coil for a given excitation signal amplitude, and hence system power consumption can be minimised. However, a high Q factor also implies that normally the frequency of the transmitted signal will remain fixed within tight limits and hence frequency and phase modulation are difficult and any changes in amplitude in terms of modulation are of restricted rapidity. Thus the bandwidth of any possible communications channel is severely restricted. In many applications, this bandwidth limitation causes users to adopt a low Q transmit antenna with consequently reduced electrical efficiency. There is also a significant problem with maintaining resonance in the transmit inductor due to the manufacturing tolerances of the reactive components 103 and 101 and also due to the large environmental changes expected. In addition to normal temperature effects, the inductance value will be significantly affected by the local environment, particularly if there are any ferromagnetic materials nearby.

At the receiving side there is another antennal coil 102 whose purpose is to convert the magnetic field from the transmitting coil 101 into an alternating voltage. This alternating voltage may be applied to a rectifier and possibly voltage multiplier function 108 which provides power to the remainder of the circuits and functions 109. There may be a separate signal path 114 to pass any modulation on the magnetic field to the circuitry 109 controlling the intended application. The receive side antenna may also be made to resonate using a capacitor 104 so that the voltage resulting is much higher and certainly sufficient to overcome any forward voltage drop in the rectifier 108 and demodulator functions in the receiver. As with the transmitter, the Q factor of the receiver coil is limited by the effective losses, modelled by a series resistance term 107. The use of a high Q in the receive antenna coil restricts the data rate of any communication link to the circuit block 109 that is established over the same magnetic coupling used during for the power transfer, and also makes the system more sensitive to component tolerances, and thus it is common to employ a modest Q factor for the receiver coil.

In order to be able to tune the transmit antenna circuit to resonance there should be means provided that can adjust the resonant frequency that are capable of operating with large signals and thus continuously variable reactance techniques common in radio design are unsuitable. In U.S. Pat. No. 7,190,153 Stover and Mann describe a system which partially addresses these requirements by switching a capacitor in and out of an inductor-capacitor (LC) circuit with a defined duty cycle that effects continuous tuning, but this has limitations insofar as with the various methods they propose for the timing of the switch there is no mechanism to minimise losses and transients in the switching operation.

Figure 2:
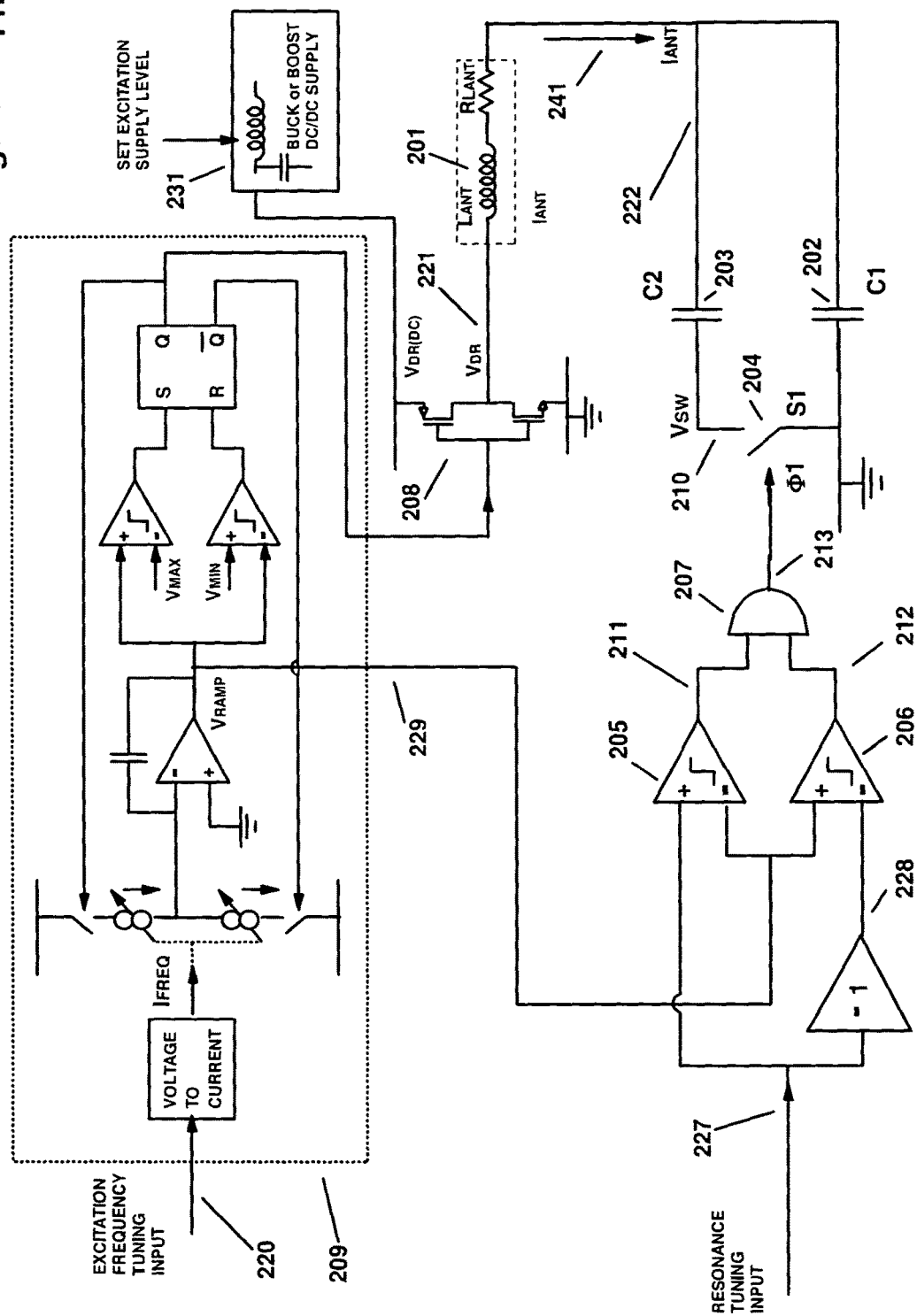
FIG. 2 shows an inductor and capacitor circuit driven by an excitation signal with means for tuning using a switch to connect and disconnect an additional capacitor in and out of circuit symmetrically about the zero crossing instant of the current in the coil according to prior art.

FIG. 2 shows an arrangement according to prior art GB2524602B Redman-White comprising essentially a coil 201 driven by a low source resistance signal source. In this example a high efficiency switch-mode driver function 208 with a variable high efficiency supply 231 provides a low resistance source for the square wave excitation voltage 221, but other arrangements and periodic excitation waveforms are also possible. The excitation signal is created by a signal generator circuit 209, whose frequency is controlled by an input signal 220. The inductor requires a series capacitor to bring it to resonance and this is provided by a switchable capacitance, 203 and a fixed capacitor 202. Other arrangements of fixed and switchable capacitors are disclosed in the said prior art. These latter capacitors are switched in and out of circuit on a cycle by cycle basis by means of at least one switch 204, preferably having a low resistance in its conducting state so as to minimise losses.

The effective capacitance change alters the resonant frequency for part of the cycle, reducing the phase rotation when in circuit and accelerating the phase rotation when out of circuit. When only one capacitor 202 is in circuit the resonant frequency has a first value, say f1, and when both capacitors 202 and 203 are in circuit, the resonant frequency is lowered to a second value, say f2. The apparent resonant frequency can be adjusted by changing the proportion of each excitation cycle in each switch state. By setting f1 and f2 to be above and below the desired operating frequency of the system, it becomes possible to tune the system to resonance taking into account any variations in electronic component values due to manufacturing tolerances or due to environmental factors.

In this embodiment of the prior art, the circuit 209 generating the excitation 221 for the tuned coil 201 is arranged to give a reference triangle signal 229, symmetrically disposed around a reference level (for the sake of clarity, this reference is illustrated here as ground potential), and whose peaks and troughs correspond to the zero crossing instants of the current 241 in the antenna coil 201 when at resonance. A tuning input signal 227 and its inverse 228 which are variable but also symmetrical about the said reference level (in this illustration ground) are compared with the reference triangle signal 229 in two comparators 205 and 206 and their respective outputs 211 and 211 are further combined in some logical function 207 to create the switch control signal 213.

Figure 3:
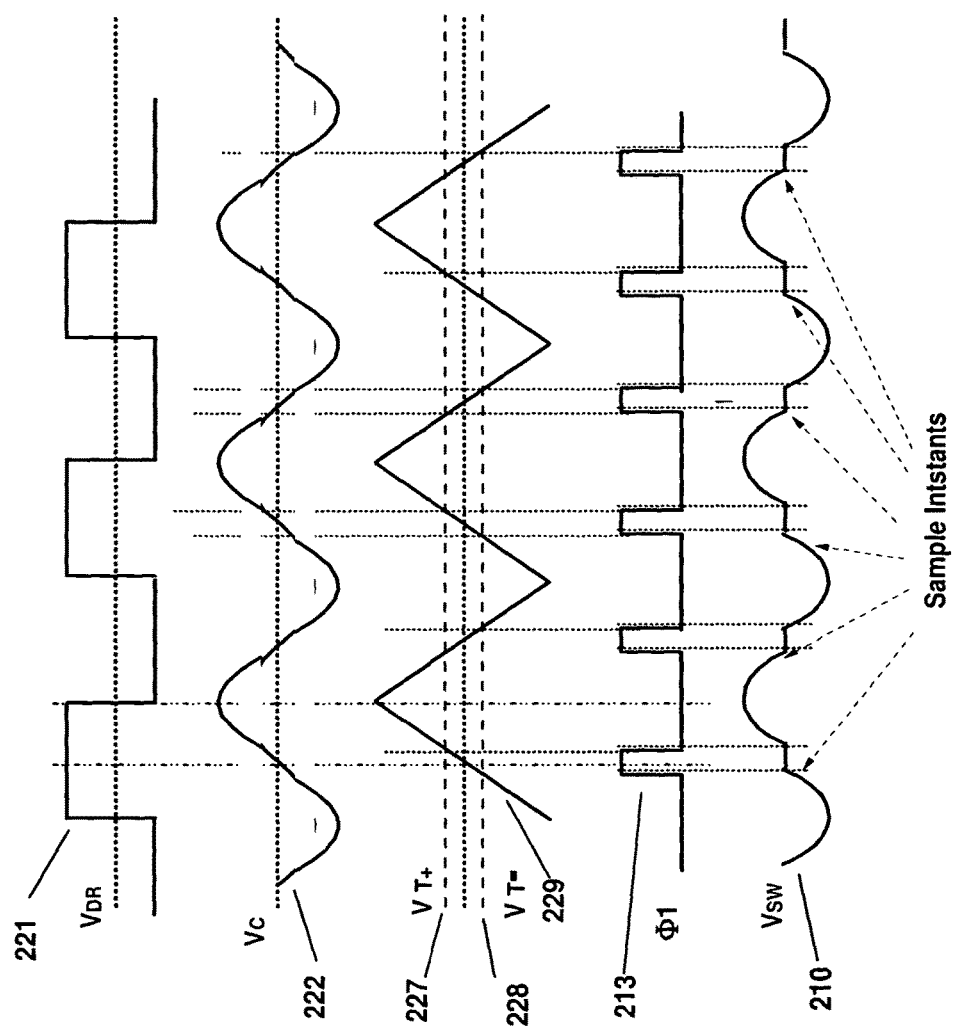
FIG. 3 shows the voltages apparent in the circuit of FIG. 2 when the system is resonating at the excitation frequency.

The waveforms seen in this arrangement when the effective resonant frequency matches the excitation frequency are shown in FIG. 3. When the at least one switch 204 is not conducting, the voltage across said switch can be seen to exhibit part of a sinusoidal waveform. The voltage waveform 222 observed at the junction between the coil 201 and the capacitors 202 and 203 has an approximately sinusoidal form, but will have a changed slope during the time when the at least one switch 204 is conducting. It will be apparent to one skilled in the art that by arranging for the at least one switch 204 to open and close at instants symmetrically disposed in time with respect to the zero crossing of the current 241 in the coil 201 when at resonance, the voltage waveform 210 across the at least one switch 204 will be seen to return to a zero value at the instant that the switch control signal 213 opens the switch, thereby minimising transients and losses.

Figure 4:
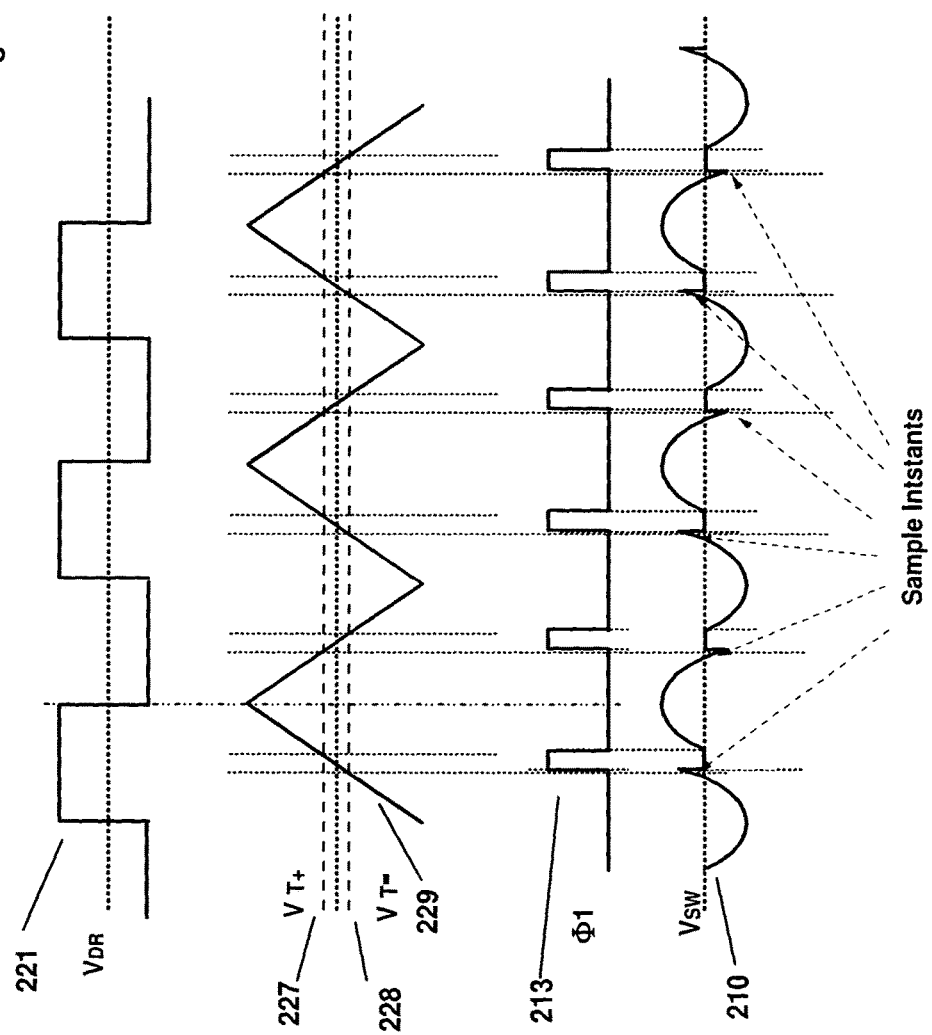
FIG. 4 shows the voltages apparent in the circuit of FIG. 2 when the tuning voltage sets the timing for a resonant frequency above the applied excitation frequency and the error signals derived from this condition.

FIG. 4 shows the waveforms evident in the arrangement of FIG. 2 when the tuning input 227 is set for a resonant frequency below the excitation frequency. The voltage waveform 210 across the at least one switch 204 can be seen to be non-zero at the instants that the said switch closes, and further, has changed sign.

Figure 5:
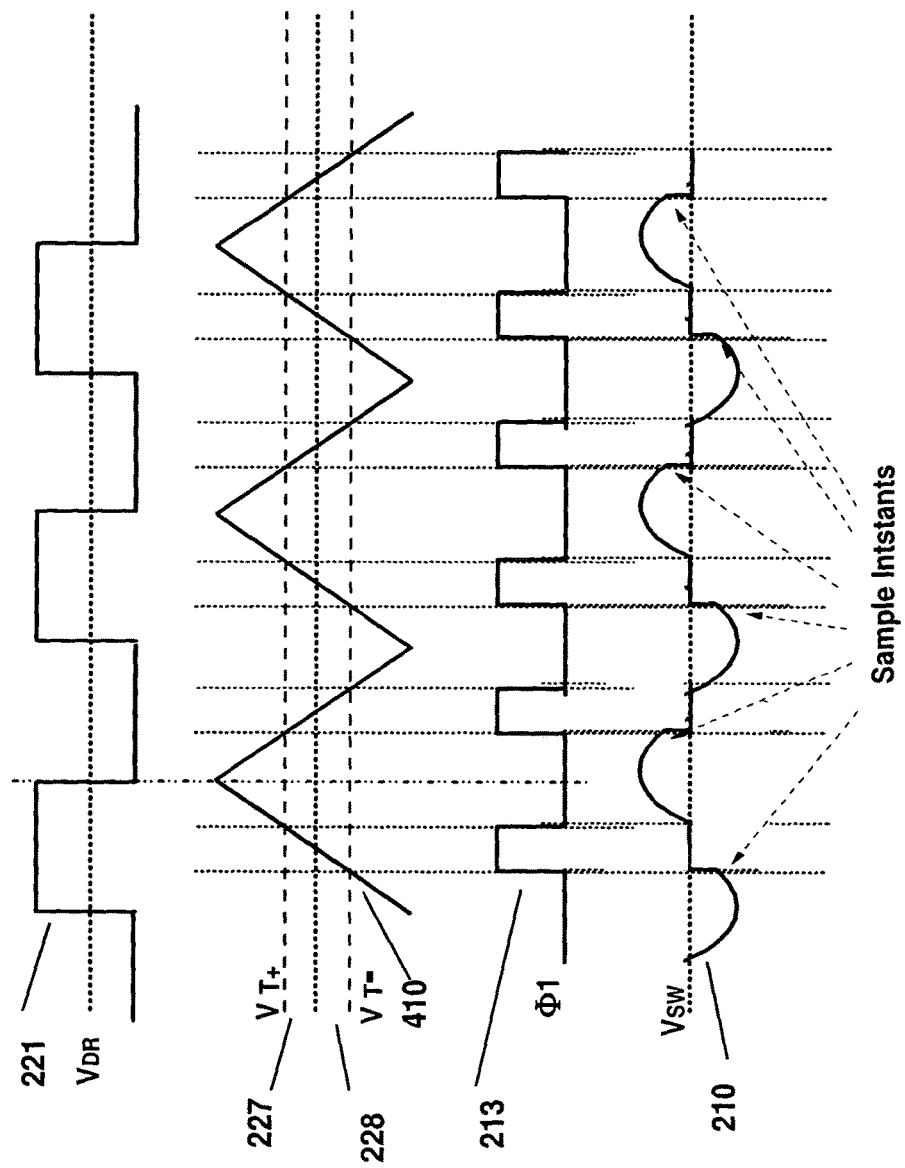
FIG. 5 shows the voltages apparent in the circuit of FIG. 2 when the tuning voltage sets the timing for a resonant frequency below the applied excitation frequency and the error signals derived from this condition.

FIG. 5 shows the corresponding waveforms when the tuning input signal 227 is set for a resonance above the excitation frequency. In this case the voltage waveform 210 across the at least one switch 204 can be seen to be non-zero at the instants that the said switch closes, but in this case has not changed sign.

Prior art GB2524602B discloses how the voltage waveform 210 across the at least one switch in this or in a related arrangement may be used to determine the error between the frequency of the excitation signal 221 and the effective resonant frequency of the arrangement comprised of the said coil and capacitors and switches.

Figure 6:
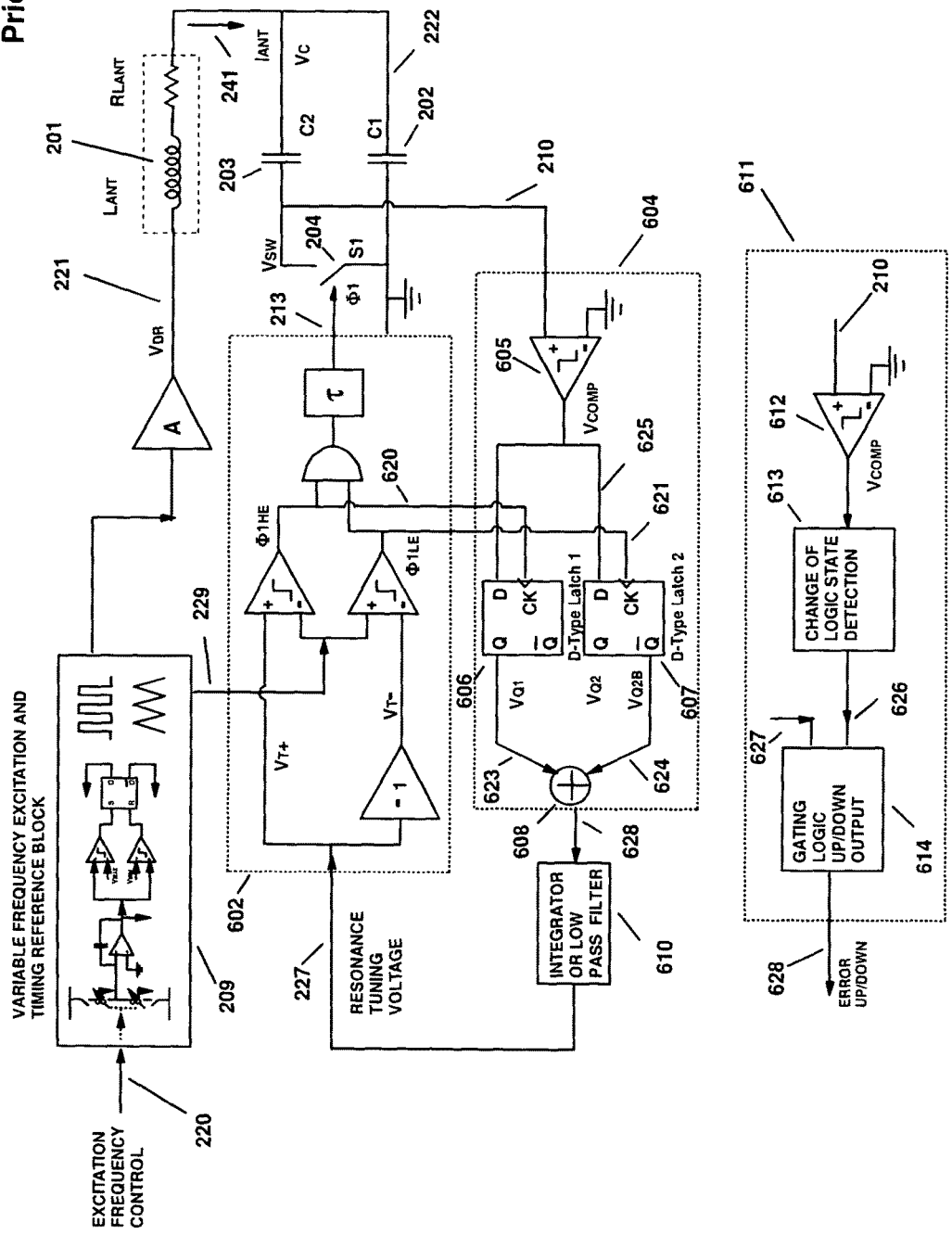
FIG. 6 shows a means for driving an inductor capacitor and switched capacitor network having variable apparent resonant frequency and the timing signals for the associated switches and for further deriving error signals resulting from the apparent resonant frequency being above or below the excitation and providing means to correct the tuning by means of the switch timing such that the system remains at resonance even if the excitation frequency changes or electronic component parameters change according to prior art.

FIG. 6 shows an embodiment according to said prior art, wherein the voltage 210 across the at least one switch 204 is combined with at least one timing signal (illustrated in this example by 620 and 621) in an error detection circuit 604 to create a correction signal 628. The logical sign value 625 of the voltage 210 across the at least one switch 204 just before it closes is detected by a comparator function 605 and is sampled in latches 606 and 607 and their latched values 623 and 624 combined to create said correction signal 628. Said correction signal may be integrated and/or low pass filtered 610 and used to generate a tuning signal 227 that may be used by the switch timing control circuits 602 to correct the tuning error and thus achieve effective resonance with low losses in the said at least one switch 204.

FIG. 6 also show an alternative means for detecting the tuning error and generating a correction signal 628 wherein a circuit 611 detects a change in the sign of the voltage 210 across the at least one switch 204 during the period when it is open. In this example a signal 626 indicating a change in the state of the logical value of the output of the comparator 612 is generated by a logical function 613 and is gated in a further logical function 614 with a signal 627 corresponding to the period during which the at least one switch 204 is open.

Many other means for creating the error signal will be apparent to one skilled in the art. Similarly many modifications to the basic arrangement are possible that provide for example easier integration in a monolithic integrated semiconductor implementation, or reduce the voltage stresses on the electronic switches.

Figure 7:
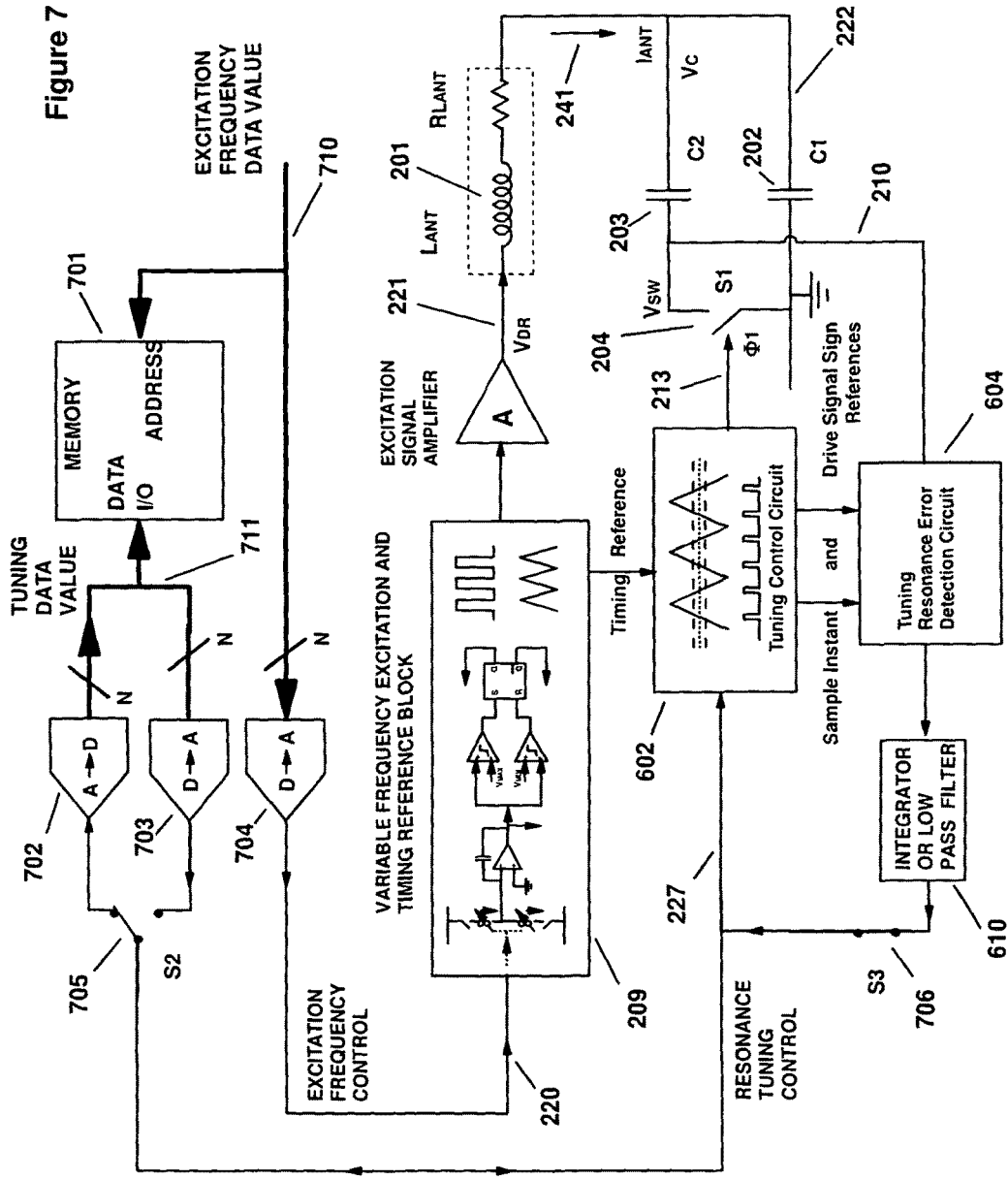
FIG. 7 shows a means for determining the relationship between the frequency of an excitation applied to a tuneable inductor-capacitor and switched capacitor network and the timing of the switches required to achieve resonance at any frequency within the system's capability to resonate and to store data relating to this relationship in a memory according to prior art.

FIG. 7 shows a further arrangement according to prior art GB2524602B wherein the excitation frequency 209 and timing generating circuit 602 are controlled by means of a digital input 710 acting via a digital to analogue converter 704. Further, the tuning value needed to achieve resonance in the LC circuit at the prevailing excitation frequency can be converted to a digital signal 711 by means of an analogue to digital converter 702 and stored as a digital value in a memory 701 and be used by means of a further digital to analogue converter 703 to achieve rapid open loop tuning of the LC circuit if the excitation frequency changes rapidly. In this mode the self-tuning feedback is interrupted by a switching function 706 and the digital to analogue converter 703 is connected via further switching function 705 and used to drive the tuning directly. Thus frequency modulation may ideally be applied to the excitation while continuously maintaining the LC circuit at resonance. Note that it will be apparent to one skilled in the art that some or all of these functions may be combined in purely digital form.

Whilst the use of stored tuning information in the memory 701 may correspond to a complete range of excitation frequencies, and thus ideally be able to track any excitation frequency changes within the system's normal range, it does not allow for long periods of continuous use when the stored signal may cease to maintain an ideal resonance condition due to changes in the circuit parameters arising from changes in temperature or other environmental factors. Hence some periodic re-calibration and storage of the tuning versus frequency characteristic will become necessary in such circumstances.

It is an aim of some embodiments of the present invention to eliminate the need for a characterisation to be undertaken with the system reconfigured and not in its normal operating mode, and this can be achieved if the frequency deviations allowed are fixed. This is a minor restriction, since in many common systems it is a requirement to send digital data, with quantised values of frequency and/or phase conveying information. This restriction of quantised values may be exploited to allow continuous updating of tuning control parameters.

It is a further aim of some embodiments of the present invention to provide means for maintaining an inductive-capacitive (LC) network at resonance while the excitation frequency may be varied between a number of discrete frequencies at desired instants controlled by a modulation input in order to permit frequency modulation (FM) or frequency shift keying (FSK), while taking into account component parameter errors due environmental and ageing as well as manufacturing tolerances. Such means should be automatic and require minimal external input for satisfactory operation.

It is a yet further an aim of some embodiments to provide means to maintain an LC network at resonance while the excitation frequency is varied on a cycle by cycle basis between a number of discrete frequencies at desired instants controlled by a modulation input to permit at phase modulation (PM) in discrete phase increments or phase shift keying (PSK) while taking into account component parameter errors due environmental and ageing as well as manufacturing tolerances. Such means should similarly be automatic and require minimal external input for satisfactory operation.

The described embodiments are applicable to LC resonant circuits in a wide range of applications, but are of particular value in inductively coupled systems such as RFID or wireless charging.

Figure 8:
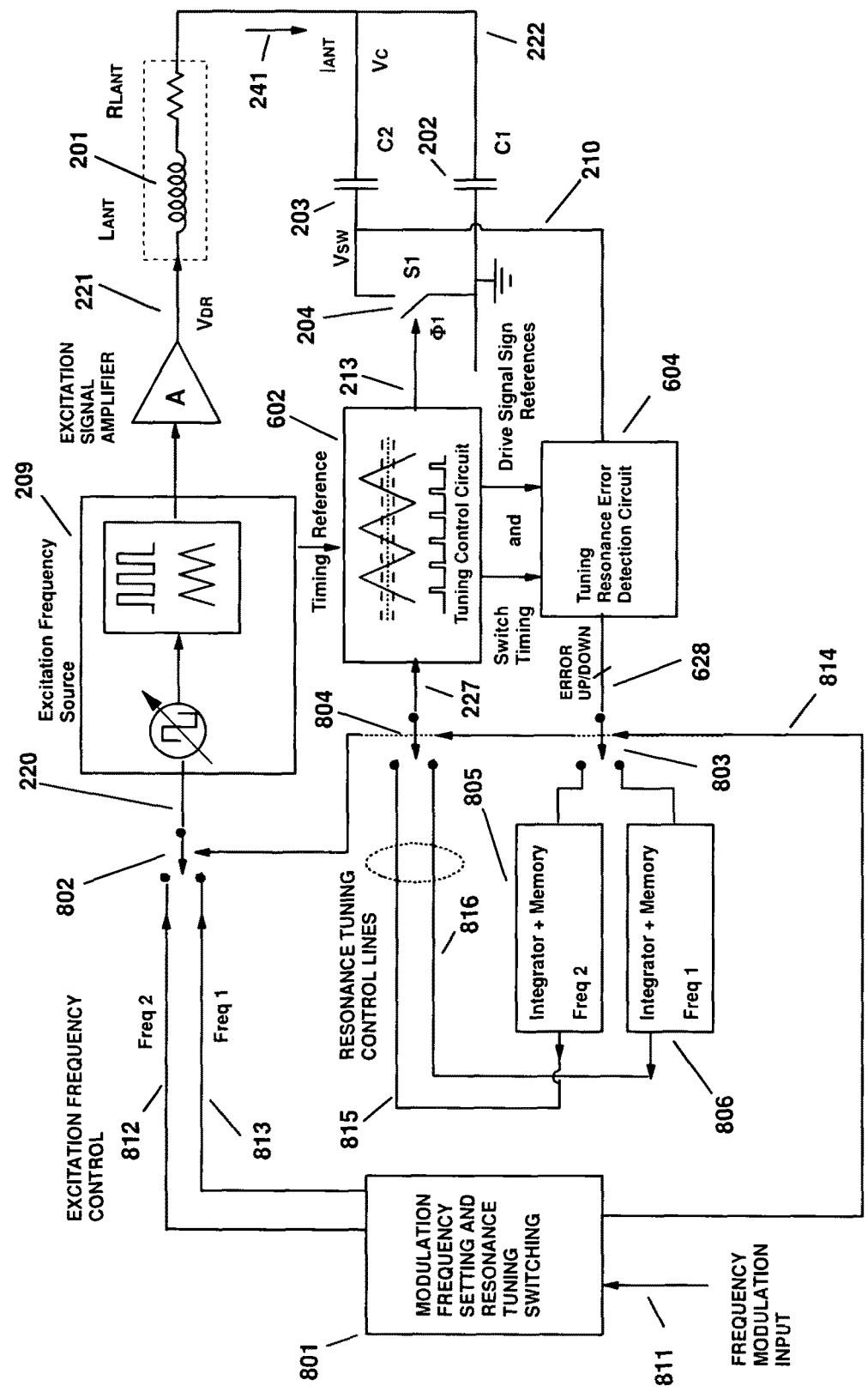
FIG. 8 shows means for maintaining resonance in an inductor when the excitation frequency is changed or modulated abruptly between at least two discrete frequencies according to an embodiment of the present invention.

FIG. 8 shows one embodiment that incorporates automatic tuning of the effective resonant frequency of the coil 201 and capacitors 202 and 203 when the excitation frequency is changed abruptly in discrete values, such as would be the case for some form of digital frequency shift keying (FSK) modulation. A control function 801 receives the modulation data signal 811 and outputs two different control values 812 and 813 to set the excitation frequency generation source 209. In this example of two excitation frequency values F1 and F2 a switch 802 connects the control signals 812 and 813 to the excitation frequency source 209 depending on the digital value of the modulation data 811. The said switch 802 is controlled by a signal 814 that indicates the state of the excitation frequency, either high or low. This control signal 814 is also used to control two further switches 803 and 804 which are used to connect into circuit different filter/integrator plus memory functions 805 and 806. When the data input 811 requires that the excitation is at frequency F1, the correction signal output 628 of the tuning and resonance detection function 604 is connected to the input of first filter/integrator plus memory 806 and same is updated while the excitation frequency is in this frequency state. At the same time, the output 816 of the filter/integrator plus memory 806 is connected to the switch timing control function 602. Hence the network comprising the inductor 201 and capacitors 202 and 203 will be maintained at resonance.

When the data input 811 requires that the excitation is at the second frequency F2, the correction signal output 628 of the tuning and resonance detection function 604 is connected to the input of second filter/integrator plus memory 805 and same is updated while the excitation frequency is in this second frequency state. At the same time, the tuning control output 815 of the second filter/integrator plus memory 805 is connected to the switch timing control function 602. Hence the network comprising the inductor 201 and capacitors 202 and 203 will be still be maintained at resonance in this changed frequency state. While the operating excitation is at the second frequency F2 and the filter/integrator plus memory 805 is in use and being updated, note that the value of the tuning control signal 816 from the first filter/integrator plus memory 806 is frozen at the last updated value, and hence is ready to set the inductor capacitor network to resonance immediately the excitation frequency is switched back to the first frequency value F1.

Provided that the data input gives rise to moderately frequent changes in frequency between these defined values, then the tuning values 815 and 816 will be periodically updated and maintained and hence resonance will be maintained in a substantially continuous manner.

Figure 9:
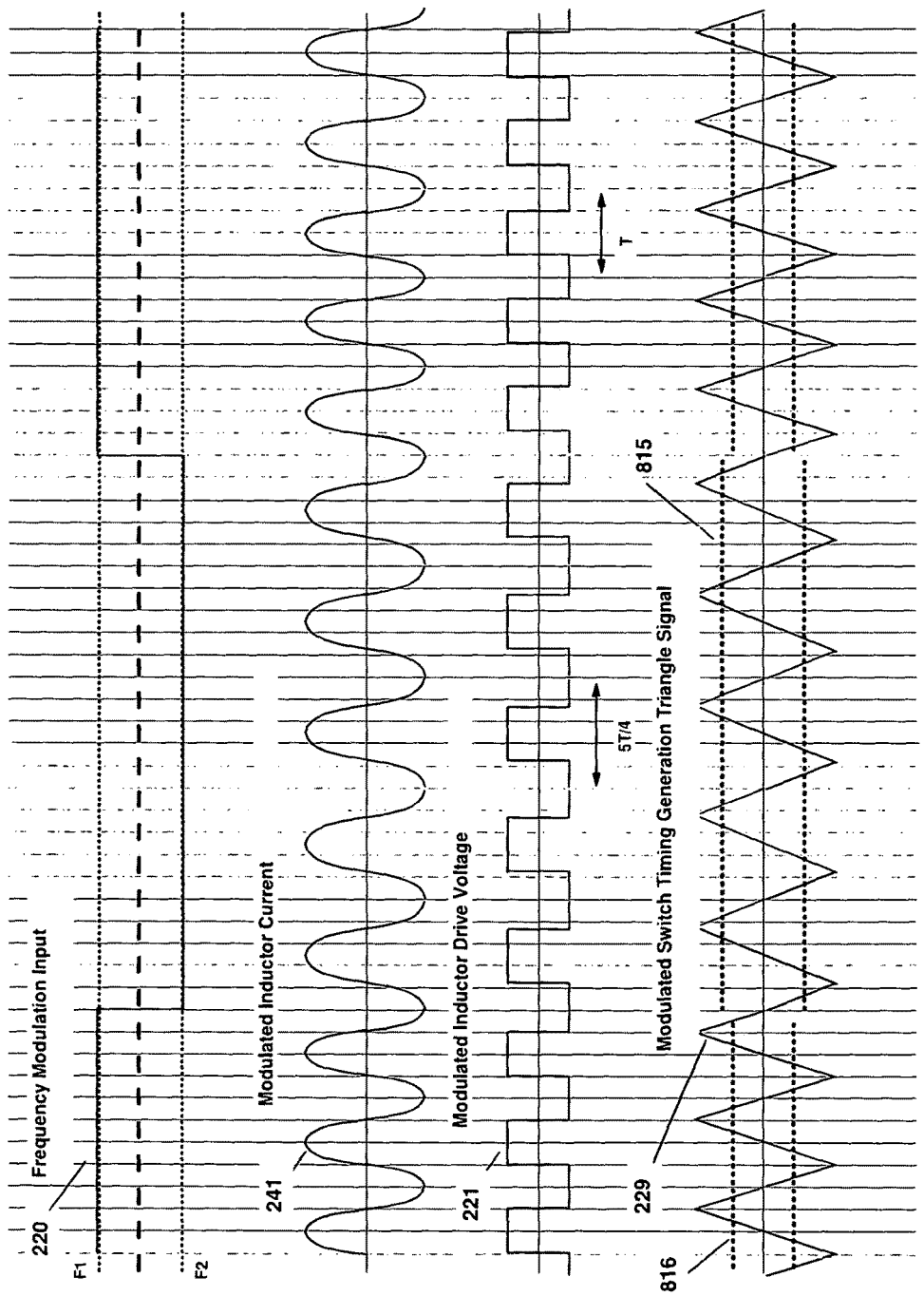
FIG. 9 shows example signals apparent in the circuit in FIG. 8 where the excitation frequency is changed or modulated abruptly between at least two discrete frequencies and the tuning value is changed between two continuously updated values according to an embodiment of the present invention.

FIG. 9 shows example waveforms as might be observed in the embodiments described in FIG. 8. Note that it is also advantageous to be able to make these frequency transitions in a manner such that the phase of the output 221 of the excitation signal generator 209 remains substantially continuous, and the transition from one frequency to another is done so that no abrupt phase changes occur and the current in the inductor is substantially continuous. FIG. 9 shows that this can be achieved if the frequency input 220 change of value is made such that the corresponding period of the excitation waveform changes synchronously with the peaks in the current waveform 241, corresponding to the minimum voltage on the capacitors. It is similarly advantageous to change the connections to the filter/integrator plus memory functions 805 and 806 such that the integrator memory associated with the new frequency value is connected and its stored tuning value 815 or 816 used for the next cycle. This advantageous timing is conveniently evident in the triangle output 229 of an integrator ramp type excitation generator such as previously described. In FIG. 9 it as also evident that the tuning input for the first frequency 816 changes to the value for the second frequency 815 at the instant that the triangle waveform also crosses zero. The triangle output voltage waveform 229 is seen to be substantially continuous around the frequency transition.

It will also be clear to one skilled in the art that the at least one switch 204 shown as a an ideal switching function in FIG. 8 may be replaced with two or more transistor switches of one or both polarities and with appropriate modifications to the timing control 602 as in a similar manner to that disclosed in GB2524602B without materially altering the intended function of the embodiments.

As mentioned above, it is highly desirable to be able to use phase modulation in conjunction with such an inductively coupled system wherein the transmit inductor has a high Q factor. Most commonly, some digital phase shift keying (PSK) is employed wherein the phase shift has discrete values. This may be a 180° binary reversal (BPSK), but this results in effectively cancelling the inductor current for a short time. To maintain the current flow in the inductor in a near continuous fashion, an offset quadrature phase shift keying (QPSK) is common wherein phase changes are constrained to 90° in either sense. The embodiments described in FIG. 8 have features that may be further used to advantage to achieve these goals.

In order to achieve a change in the phase of the excitation while maintaining continuity of phase, the frequency of the excitation may be changed for a short interval during which the accumulated phase in that interval differs by the intended quantity from the phase that would be accumulated by the unaltered nominal excitation frequency. Thus to increase the phase by +90° one may increase the frequency during a complete period such that the end of single complete period of the increased frequency corresponds to the time instant where the accumulated phase of the nominal excitation frequency would be $3\pi/2$ instead of $2\pi$. Hence on reverting to the nominal frequency, the phase will have advanced by $\pi/2$ with respect to the unaltered excitation. This corresponds to a frequency increase of 4/3 for one period. To achieve a phase change of −90° one may similarly decrease the frequency such that the end of single complete period of the decreased frequency corresponds to the time instant where the accumulated phase of the nominal excitation frequency would be $5\pi/2$ instead of $2\pi$. Hence on reverting to the nominal frequency the phase will have been delayed by $\pi/2$ with respect to the unaltered excitation. This corresponds to a frequency decrease of 4/5 for one period.

Alternatively, the phase change may be effected less abruptly over a larger number of excitation periods, which may have benefits in reducing the bandwidth of the modulation components in the system. For example to increase the phase by 90° over two periods of the excitation, one may increase the frequency during two complete periods such that the end of two complete periods of the increased frequency corresponds to the time instant where the accumulated phase of the nominal excitation frequency would be $7\pi/2$ instead of $4\pi$. Hence on reverting to the nominal frequency the phase will have advanced by $\pi/2$ with respect to the unaltered excitation. This corresponds to a frequency increase of 8/7 for one period. The shortest duration over which the frequency may be altered in the embodiments of the present invention is one half period of the excitation frequency. It will be apparent to one skilled in the art that any practical discrete phase increments for modulation may be achieved by suitable choices of frequency change and number of half periods, and the rate of change of phase may be similarly adjusted by choice of the number of half cycles at an adjusted frequency.

Figure 10:
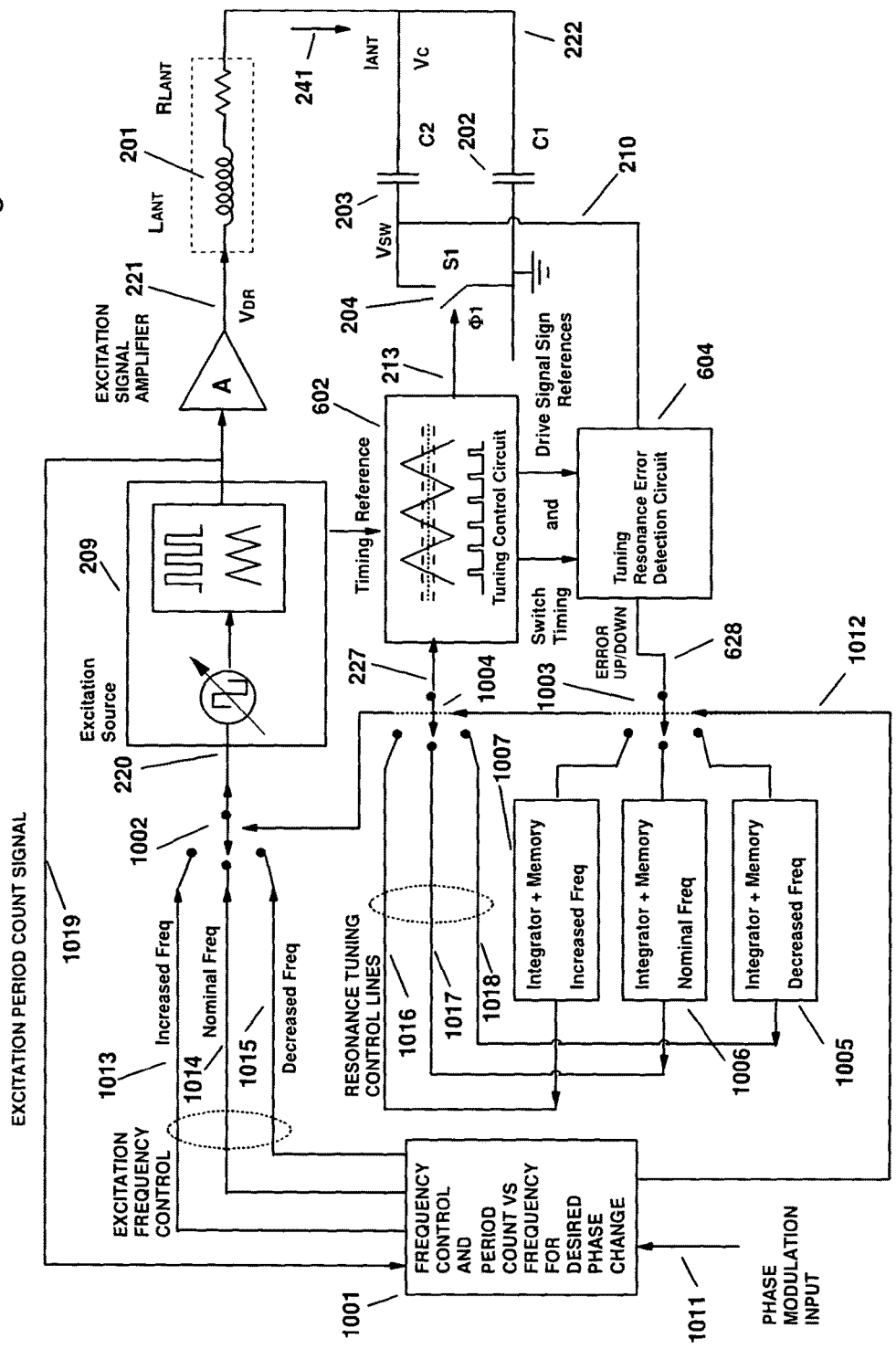
FIG. 10 shows a means for applying an excitation signal to a tuneable inductor capacitor and switched capacitor network and for maintaining said network at resonance while the phase of the excitation frequency may be varied in discrete increments by means of changing the excitation frequency for integer numbers of half periods at defined higher or lower frequencies and means for altering the switch timing relating the instantaneous excitation frequency in a manner required to maintain resonance according to an embodiment of the present invention.

FIG. 10 shows some embodiments of the invention that may be used to permit phase modulation of the excitation signal 221 with discrete positive or negative phase changes. A control function 1001 sets the nominal frequency for the excitation source 209 by means of a control value 1014. The inductor 201, capacitors 202 and 203, and switch 204 network is maintained at resonance by sensing the voltage across the at least one switch 204 and deriving a tuning correction signal 628 which filtered and/or integrated and held in a memory function 1006, and its output 1017 used to control the timing of the at least one switch 204 as by means of a timing control function 602 as disclosed in the prior art GB2524602B. To achieve phase modulation of the excitation with discrete phase increment or decrement values one may as described above alter the frequency by a defined value for a defined number of half periods. In the example shown, the control function 1001 creates additional frequency control signals 1013 and 1015 that will either increase or decrease the excitation frequency by prescribed values.

On receipt of phase modulation data 1011, for example to increase the relative phase, the control function 1001 outputs a switching signal 1012 that operates switches 1002 and connects the control signal 1013 to the excitation source 209. The source then outputs an increased frequency. In the case of an analogue implementation of the embodiments it is advantageous to employ a feedback signal 1019 from the output of the excitation source 209 to the control function 1001 to allow the control function to count the number of half periods that are output to the network of the inductor 201 and capacitors 202 and 203 and hence determine when the desired phase change has been effected. At the same time as the excitation frequency is changed, the switching signal 1012 also controls switch 1003 such that the correction signal output 628 from the resonance detection function 604 is connected to a filter/integrator plus memory function 1007 that holds the tuning control value 1016 which has been stored from previous operation at the said increased frequency. The current value in the filter/integrator plus memory function 1006 is then frozen. The switching signal 1012 also controls switch 1004 such that the tuning control circuit 602 is controlled by the tuning control value 1016. Hence despite the abrupt change of frequency the inductor capacitor network is maintained at resonance. While operating at this increased frequency the tuning error signal 628 continues to adjust the resonance control value 1016 such that environmental, ageing and other effects on the operating parameters of any of the system's components are compensated.

When the desired number of half cycles at the increased frequency have been output by the excitation source 209 and the desired phase change achieved, the control function 1001 outputs the switch control signal 1012 to operate switches 1002 1003 and 1004 so that all the connections are restored to the nominal frequency settings. The updated value of the filter/integrator plus memory function 1007 is then frozen and the corresponding filter/integrator plus memory function 1006 is once again updated by the tuning correction signal 628.

In the case where the phase modulation data 1011 requires a decrease in the relative phase, the control function 1001 outputs a switching signal 1012 that operates switches 1002 and connects the frequency control signal 1015 to the excitation source 209. At the same time as the excitation frequency is changed, the switching signal 1012 controls switch 1003 such that the correction signal output 628 of the resonance detection function 604 is connected to a filter/integrator plus memory function 1005 that holds the tuning value 1018 which has been stored from previous operation at the said decreased frequency. The current value in the filter/integrator plus memory function 1006 is then frozen. The switching signal 1012 also controls switch 1004 such that the tuning control circuit 602 is controlled by the tuning control value 1018. Hence despite the abrupt change of frequency the inductor capacitor network is maintained at resonance.

Figure 11:
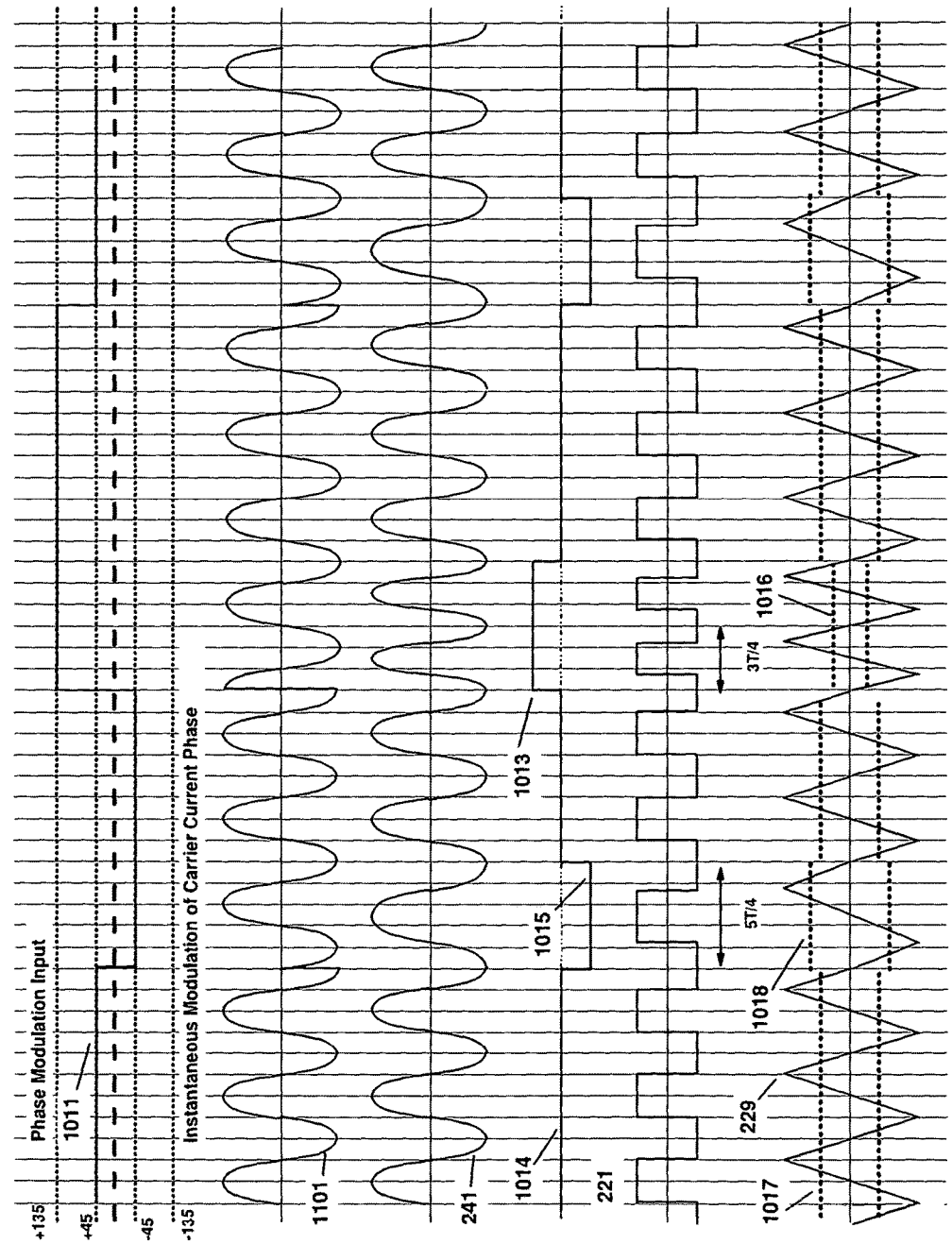
FIG. 11 shows example signals apparent in the circuit in FIG. 10 where the excitation frequency is changed between at least two discrete values for integer numbers of half periods to change the phase of the excitation and where the tuning value is similarly changed between at least two continuously updated values to maintain resonance according to an embodiment of the present invention.

FIG. 11 shows example waveforms such as might be observed in the circuits in FIG. 10. In this example the phase modulation input 1011 is shown to have increments of +/−90°, but for illustration purposes, has not been constrained to single increments or decrements. Waveform 1101 shows how an idealised sinusoidal excitation signal may be modulated in phase. Note that a sinusoid is shown here purely to make the nature of the phase modulation clear. In a practical system, a switching excitation is often preferred. It will be seen that there are abrupt changes in the waveform. In the case of the +180° phase change, there is an abrupt and instantaneous reversal of the signal. Such changes will lead to large harmonic content in the excitation and complete cancellation of the inductor current for an interval. The second waveform shows an example of the inductor current 241 when the preferred embodiments of the invention as shown in FIG. 10 are employed.

The frequency control signal at the nominal frequency 1014 is seen to change to the decreased value 1015 for one period of the excitation 221 after the phase modulation input 1011 indicates that a −90° phase change is required. The tuning control value 1017 that defines the switch timing to obtain resonance is changed to the new level 1018. When combined with the excitation triangle reference signal 229, the at least one switch 204 remains closed for a longer proportion of the period, such that the resonant frequency is reduced to match the reduced excitation frequency. At the end of one complete period at this decreased frequency, which corresponds to 5/4 times the nominal period, the frequency control value returns to the nominal value 1014. At the end of this process the inductor current 241 is seen to align precisely in phase with the idealised abrupt phase modulated waveform as a result of this smooth phase change.

The phase modulation input 1011 is also shown for the case where a phase change of +180° is required, and the idealised modulation of a sinusoidal signal 1101 illustrates this. In this case the excitation control signal is changed from the nominal value 1014 to an increased value 1013. The excitation frequency 221 is seen to increase for two complete periods, corresponding to 2×3/4 times the nominal period, and during the same time, the tuning reference signal 1017 is seen to change to a different level 1016. When combined with the excitation triangle signal 229 in an analogue embodiment, this alters the timing of the at least one switch 204 such that it is closed for a shorter period thereby increasing the resonant frequency to match the increased excitation frequency. At the end of the two complete periods the frequency control value returns to the nominal value 1014. The inductor current 241 as a result of this smooth phase change is again seen to align precisely in phase with the idealised abrupt phase modulated waveform after the phase modulation.

Note that in each frequency transition the triangle reference signal 229 is seen to change frequency at the point where the current is a maximum and the voltage on the capacitors 202 and 203 is a minimum and the tuning reference value 1017 and 1018 changes at the same time so that phase continuity in both excitation and tuning is achieved.

Figure 12:
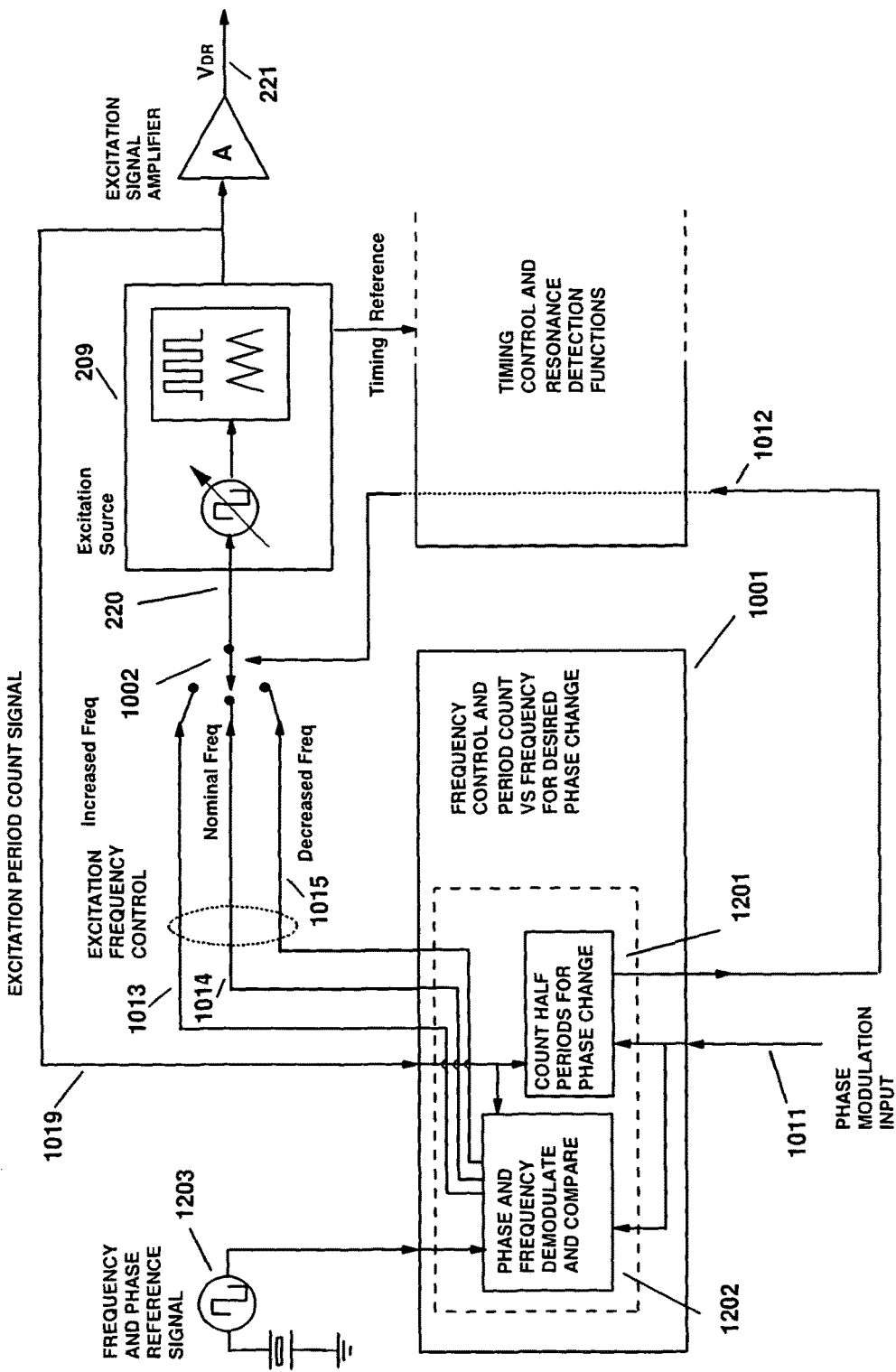
FIG. 12 shows means for changing the excitation frequency in discrete increments or decrements for defined numbers of half periods such that the phase of the excitation frequency is changed and the signal phase is continuous throughout these changes according to an embodiment of the present invention.

FIG. 12 shows a further embodiment according to the invention relating to the control of the frequency increase and decrease and the control of the number of periods of changed frequency to effect a desired phase change. In a substantially analogue implementation, the precise value of the increased and decreased frequency may be difficult to fix due to manufacturing tolerances and drift as a result of environmental factors. In FIG. 12 the feedback signal 1019 is taken to the control function 1001 and there its instantaneous frequency and phase compared with that from a fixed reference signal 1203 and thereby the accuracy of the phase modulation can be maintained. A possible means for achieving this is shown in the figure wherein a phase and frequency demodulation operation 1202 is performed. The instantaneous frequency error values so derived may be used to adjust the frequency control values 1013, 1014 and 1015. Taken together with a count of the number of periods obtained by means of a counting function 1201 from the feedback signal 1019, the precise timing of the switch control signal 1012 may be assured.

Figure 13:
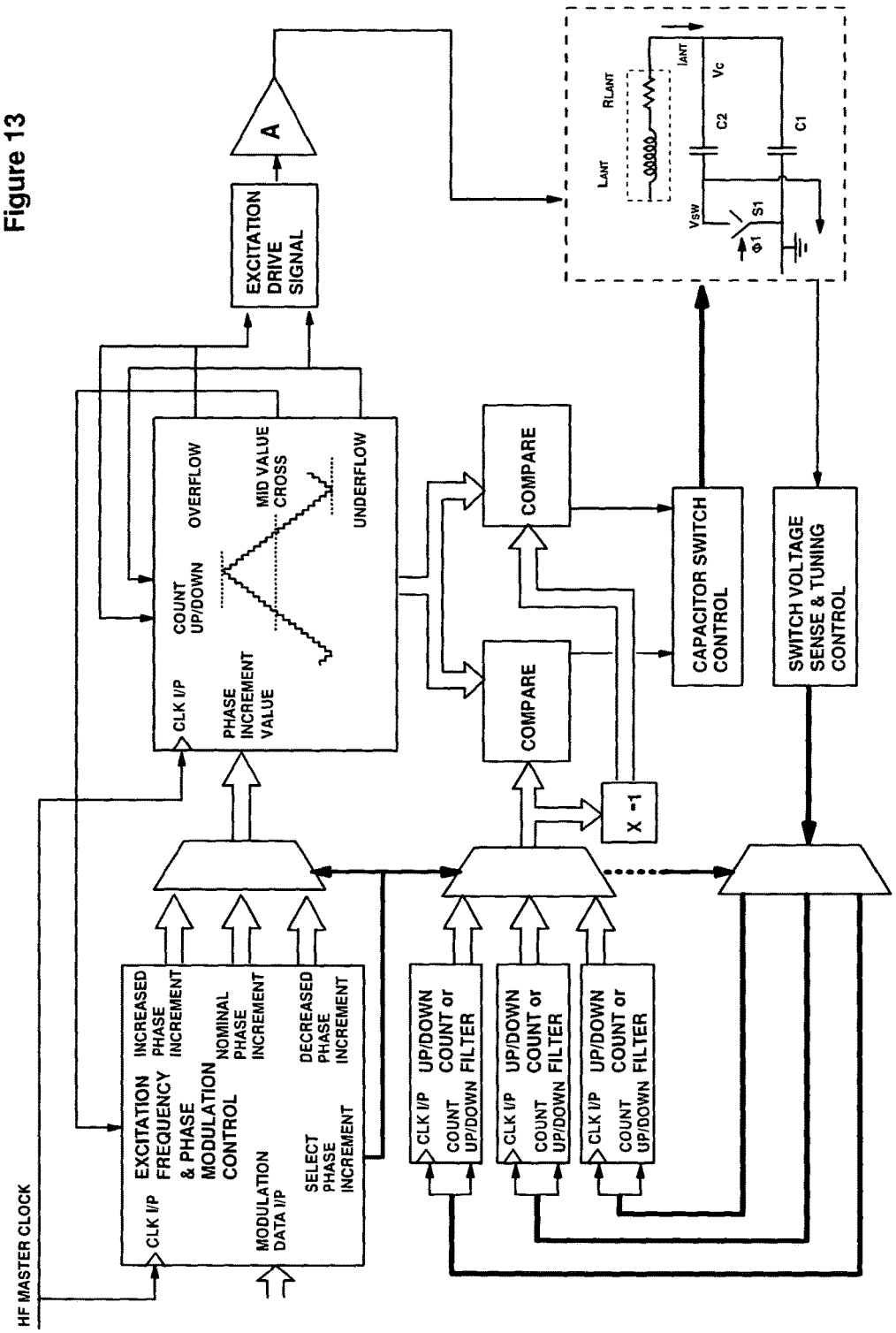
FIG. 13 shows a substantially digital implementation of the means changing the excitation frequency in discrete increments or decrements for defined numbers of half periods such that the phase of the excitation frequency is changed and the signal phase is continuous throughout these changes according to an embodiment of the present invention.

FIG. 13 shows a yet further embodiment according to the invention wherein the functions are substantially digital. In this example of the embodiment, the required three excitation frequencies may be derived with precision from a single high frequency master clock 1328. The excitation for the inductor capacitor network 1300 is generated by a digital oscillator function 1301 wherein the frequency is obtained from the count rate of an up/down counter creating the numerical equivalent of an analogue ramp. The overflow 1325 and underflow 1326 signals control the reversal of the ramp and the rate of counting and hence the frequency of the excitation is determined by the phase increment variable 1321. Because the complete system is locked to the same clock 1328 the control function 1302 is able to compute precisely the values for the nominal, increased and decreased phase increment values 1323, 1322 and 1324 respectively and to determine the precise time at which these should be switched by multiplexer 1308 to the excitation source 1301. A feedback signal 1327 may optionally also be provided to the control function 1302 to assist in the phase and frequency control. Similarly the tuning control filter/integrator and memory functions (1311, 1312 and 1313 in this example), may be implemented in purely digital form for all of the different excitation frequencies employed for the modulation and their input and output connections (1341, 1342, 1343, and 1331, 1332, 1333 respectively) may be changed by multiplexers 1309 and 1310. The tuning error signal 1338 may be obtained in a function 1307 that senses the voltage across the capacitor switch 204 in a similar manner as described in the cited prior art.

The tuning switch control signal 213 is obtained by comparing the count value 1340 with the instantaneously valid tuning control variable 1334 and its numerical inverse 1335 in digital comparison functions 1304 and 1305, whose outputs 1337 and 1336 respectively may be used by a control function 1306 to create the said control signal 213.

Figure 14:
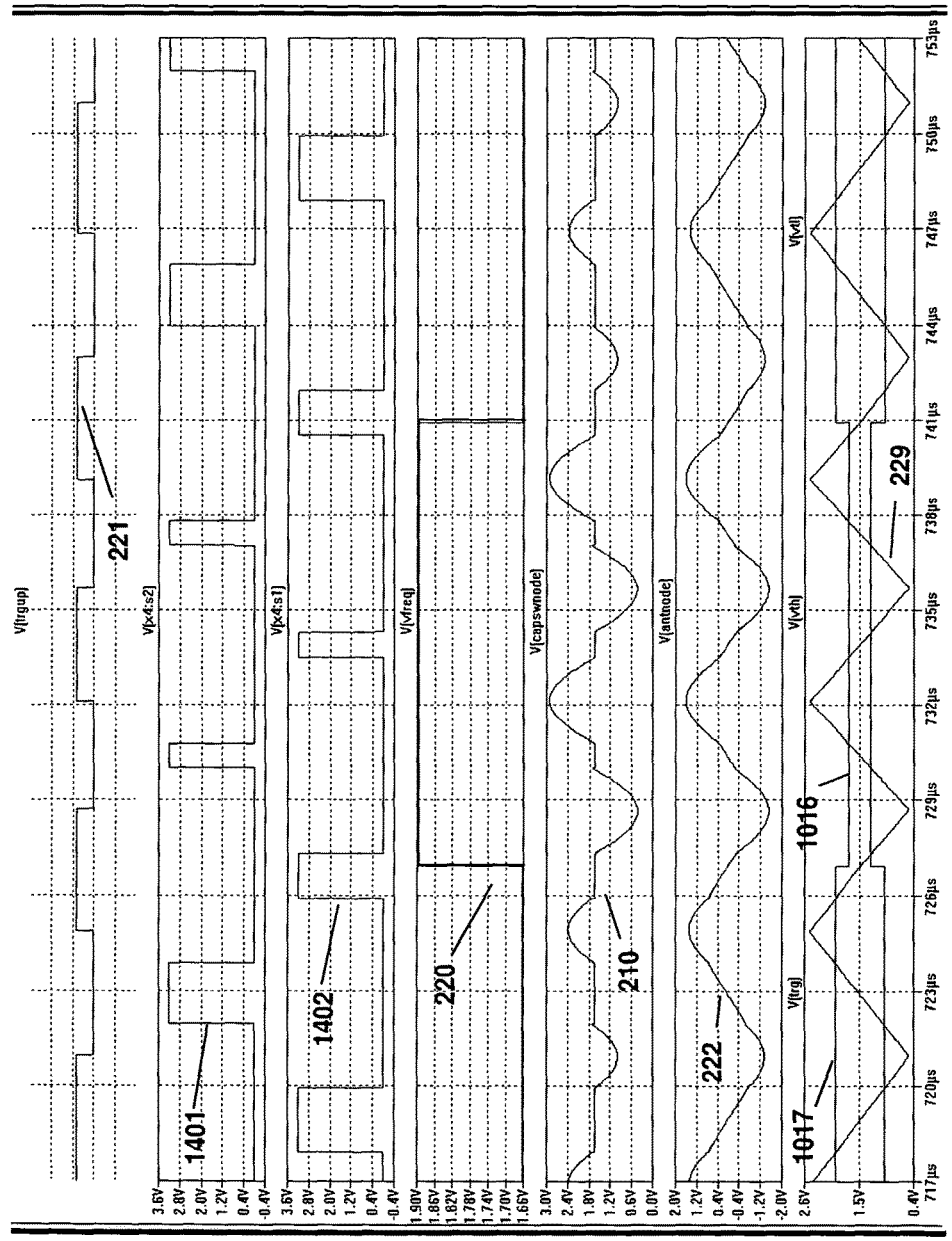
FIG. 14 shows simulated signals from a system similar to that in FIG. 12 according to an embodiment of the present invention.

FIG. 14 shows example waveforms from a simulation of an embodiment according to the invention using substantially analogue techniques wherein a phase change of +90° is effected by increasing the frequency of the excitation 221 for two complete periods. The frequency control input 220 is seen to increase for this period. The change is synchronous with the zero crossing of the triangle reference 229 as is the change of the tuning reference value 1017 to 1016. The sensed voltage 210 across the at least one switch 204 is seen to maintain a substantially zero value at the instants that the control signals 1401 and 1402 close the switch indicating that the circuit has maintained resonance throughout the phase modulation process.

The embodiments described herein are given to explain the function of the invention but it will be apparent to one skilled in the art that many other implementations and arrangements are possible. The means for generating the various excitation and control signals may be substantially analogue or substantially digital or a combination of techniques. Many arrangements of the inductor, switches and capacitors are possible that may be preferable for integrated circuit implementations or to limit the voltage present on one or more of the components. It also possible to implement the drive to the inductor capacitor and switch network in complementary or differential form.

Whilst embodiments of this invention have been described with reference to particular examples these should not be interpreted as restricting the scope of the invention in any way. It is to be made clear that many other possible embodiments, modifications and improvements may be incorporated into or with the invention without departing from the scope of the invention as set out in the claims.

The invention claimed is:

1. A method for maintaining resonance of a tuned circuit selecting between two or more discrete excitation frequencies, the tuned circuit comprising an arrangement an inductance connected in combination with an arrangement of at least one switch connected in combination with one of at least two capacitors, a duty cycle of the at least one switch configured to vary an apparent resonant frequency of the tuned circuit; and a source providing a excitation signal, the method comprising selecting between the two or more discrete excitation frequencies, the method comprising:

sensing a voltage across the at least one switch when the at least one switch is in an open state;

deriving a tuning control signal from the sensed voltage, wherein deriving a tuning control signal comprises:
  deriving a correction signal from the sensed voltage wherein the correction signal is configured to alter the apparent resonant frequency to correspond with a selected one of the discrete excitation frequencies; and
  generating at least two tuning control signals from the correction signal, each tuning control signal associated with a respective one of the two or more discrete excitation frequencies; and
  controlling the timing of the opening and closing of the at least one switch in a manner based on the derived tuning control signal at each of the two or more discrete excitation frequencies such that the voltage across the at least one switch when the at least one switch is in the open state immediately prior to closing is substantially zero;
controlling the selecting between the two or more discrete excitation frequencies, wherein controlling the selecting between the two or more discrete excitation frequencies comprises selecting the tuning control signal associated with a respective one of the two or more discrete excitation frequencies with which the tuned circuit is being driven to enable controlling of the timing of the opening and closing of the at least one switch in a manner based on the derived tuning control signals at each of the two or more discrete excitation frequencies.

2. A circuit configured to maintain resonance of a tuned circuit selecting between at least two discrete excitation frequencies, the tuned circuit comprising an arrangement of an inductor connected in combination with an arrangement of at least one switch connected in combination with one of at least two capacitors, a duty cycle of the at least one switch configured to vary an apparent resonant frequency of the tuned circuit; and a source providing an excitation signal, the source comprising means for selecting between the at least two discrete excitation frequencies, the circuit configured to maintain resonance comprising:
  a voltage sensor configured to sense a voltage across the at least one switch when the at least one switch is in an open state;
  tuning control circuitry configured to control the apparent resonant frequency of the tuned circuit, comprising:
    correction signal circuitry configured to derive a correction signal from the said sensed voltage wherein the correction signal is configured to alter the apparent resonant frequency to correspond with a selected one of the at least two discrete excitation frequencies; and
    tuning signal circuitry configured to generate at least two tuning control signals configured to selectively receive the correction signal, each tuning control signal associated with a respective one of the at least two discrete excitation frequencies, said tuning signal circuitry further comprising at least two tuning control signal generators, each tuning control signal generator associated with a respective one of the at least two discrete excitation frequencies; and
  switch timing control circuitry configured to control the timing of the opening and closing of the at least one switch in a manner based on the derived tuning control signal associated with each of the at least two discrete excitation frequencies such that the voltage across the at least one switch when the at least one switch is in the open state immediately prior to closing is substantially zero; and
  frequency selection control circuitry configured to select between the at least two discrete excitation frequencies, and further configured to connect the tuning control signal associated with the selected discrete excitation frequency with which the tuned circuit is being driven to the switch timing control circuitry controlling the timing of the opening and closing of the at least one switch and said frequency selection control circuitry is further configured to control the timing of the opening and closing of the at least one switch in a manner based on the selected derived tuning control signal at each of the at least two discrete excitation frequencies.

3. The circuit as claimed in claim 2, wherein each tuning control signal generator comprises:
  an integrator and/or filter configured to integrate and/or low pass filter the correction signal derived from the sensed voltage across the at least one switch when the at least one switch is in the open state to generate the tuning control signal and the frequency selection control circuitry configured to select between the at least two discrete excitation frequencies is configured to connect the respective tuning control signal generator; and
  a memory configured to store the integrated and/or filtered correction signal when the frequency selection control circuitry configured to select between the at least two discrete excitation frequencies is configured to connect the respective tuning control signal generator.

4. The circuit as claimed in claim 2, wherein the frequency selection control circuitry configured to select between the at least two discrete excitation frequencies is configured to select between the two or more discrete excitation frequencies based on a frequency shift keying modulation input to enable frequency shift keying.

5. The circuit as claimed in claim 2, wherein the frequency selection control circuitry configured to select between the at least two discrete excitation frequencies is configured to select between the two or more discrete excitation frequencies based on a phase shift keying modulation input and for a determined discrete number of half periods of the excitation.

6. The circuit as claimed in claim 5, wherein the frequency selection control circuitry configured to select between at least two discrete excitation frequencies is configured to enable at least one of:
  a nominal excitation frequency coupled to the tuned circuit and a nominal frequency control signal generator coupled to the switch timing control circuitry configured to control the timing of the opening and closing of the at least one switch;
  an increased excitation frequency coupled to the tuned circuit and an increased frequency control signal generator coupled to the switch timing control circuitry configured to control the timing of the opening and closing of the at least one switch for a determined discrete number of half periods of the excitation to effect a first determined phase change;
a decreased excitation frequency coupled to the tuned circuit and a decreased frequency control signal generator coupled to the switch timing control circuitry configured to control the timing of the opening and closing of the at least one switch for a further determined discrete number of half periods of the excitation to effect a further determined phase change.

7. The circuit as claimed in claim 2, wherein the frequency selection control circuitry configured to select between the at least two discrete excitation frequencies is configured to synchronously connect the tuning control signal generator associated with the discrete excitation frequency to which the tuned circuit is to be selected such that an excitation phase of the excitation frequency is continuous when the selecting between the two or more discrete excitation frequencies and the tuning control signal generator occurs.

8. The circuit as claimed in claim 2, wherein the frequency selection control circuitry configured to select between the two or more discrete excitation frequencies and to connect the tuning control signal generator associated with the discrete excitation frequency to which the tuned circuit is to be selected such that the voltage across the at least one switch when the at least one switch is in the open state at an instant immediately prior to closing is substantially zero when the selection between the two or more discrete excitation frequencies and the tuning control signal generator occurs.

9. The circuit as claimed in claim 2, further comprising:
monitoring circuitry configured to monitor an output of the tuned circuit;
demodulating circuitry configured to demodulate the output of the tuned circuit with a reference signal frequency; and
correcting circuitry configured to correct at least one of the discrete excitation frequencies based on the demodulated output.

10. The circuit as claimed in claim 2, wherein the apparent resonant frequency is configured to be varied by controlling the duty cycle of the opening and closing of the at least one switch.

11. The circuit as claimed in claim 10, wherein the switch timing control circuitry configured to control the timing of the opening and closing of the at least one switch is configured to control the opening and closing instants of the said at least one switch:
to be synchronous with the applied excitation signal; and
to be substantially equally spaced in time around a peak of a voltage at the connection between the inductor and the arrangement of at least one switch connected in combination with one of at least two capacitors when the circuit is at resonance.

12. The circuit as claimed in claim 10, wherein the switch timing control circuitry configured to control the timing of the opening and closing of the at least one switch is configured to control instants at which the at least one switch opens and closes that are substantially equally spaced in time around a peak of a voltage at the connection between the inductor and the arrangement of at least one switch connected in combination with one of at least two capacitors when the circuit is at resonance.

13. The circuit as claimed in claim 2, further comprising comparison circuitry configured to compare the apparent resonant frequency with the frequency of the applied excitation signal and for determining a sign of the result of the comparison, said comparison circuitry using the voltage sensed across said at least one switch.

14. The circuit as claimed in claim 13, wherein the tuning control circuitry configured to derive the tuning control signal from the sensed voltage is configured to generate the tuning control signal from the sign of the difference between the apparent resonant frequency and a selected excitation frequency.

15. The circuit as claimed in claim 14 wherein the tuning control signal is used by the switch timing control circuitry configured to control the timing of the opening and closing of the at least one switch to alter the timing of the at least one switch so that the apparent resonant frequency corresponds with a selected excitation frequency.

16. The circuit as claimed in claim 2, wherein the switch timing control circuitry configured to control the timing of the opening and closing of the at least one switch comprises on-off ratio circuitry configured to control a ratio of an on-to-off time of the at least one switch based on the tuning control signal so as to alter the apparent resonant frequency of the tuned circuit.

17. The circuit as claimed in claim 2 wherein the switch timing control circuitry configured to control the timing of the opening and closing of the at least one switch is configured to control the timing of the opening and closing of the at least one switch such that the sensed voltage across the at least one switch is substantially zero at the instant immediately before it closes when the circuit is at resonance.

18. The circuit as claimed in claim 17 wherein the tuning control circuitry configured to derive the tuning control signal from the sensed voltage is configured to compare the apparent resonant frequency with the frequency of the applied excitation signal and for determining a sign of the result of the comparison, said tuning control circuitry using the voltage sensed across said at least one switch at an instant immediately before closing.

19. The circuit as claimed in claim 17 wherein the tuning control circuitry configured to derive the tuning control signal from the sensed voltage is configured to compare the apparent resonant frequency with the frequency of the applied excitation signal and for determining the sign of result of the comparison, said tuning control circuitry using changes in a sign of the voltage sensed across said at least one switch during the period it is open.

* * * * *